PRODUCTION OF CIRCUIT DEVICE

Filed Oct. 24, 1965

INVENTORS
Hans-Jürgen Schütze &
Klaus Hennings
BY Spencer & Kaye
ATTORNEYS

INVENTORS
Hans-Jürgen Schütze &
Klaus Hennings

BY Spencer & Kaye

ATTORNEYS

United States Patent Office 3,427,709

Patented Feb. 18, 1969

3,427,709

PRODUCTION OF CIRCUIT DEVICE

Hans-Jürgen Schütze and Klaus Hennings, Ulm (Danube), Germany, assignors to Telefunken Patentverwertungs-gesellschaft m.b.H., Ulm (Danube), Germany Filed Oct. 24, 1965, Ser. No. 504,568
Claims priority, application Germany, Oct. 30, 1964, T 27,325; Dec. 19, 1964, T 27,657
U.S. Cl. 29—580 9 Claims
Int. Cl. H01l 5/00, 7/36

ABSTRACT OF THE DISCLOSURE

A method for permitting all of the regions of a semiconductor device to be contacted at one surface thereof by forming a plurality of isolated monocrystalline regions from a semiconductor body, each of which regions is to define one semiconductor device, and partially enclosing each region with a low-resistance layer for establishing a conductive connection between the two opposed surfaces of the region.

Figure 1A:
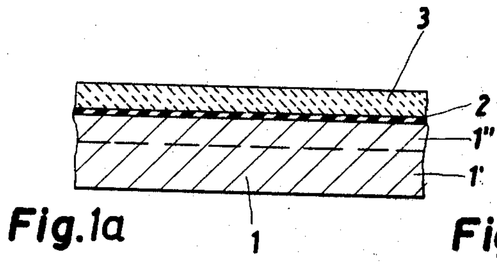

The present invention relates to the production of a circuit device, and particularly a circuit device containing transistors having a low collector resistance and/or diodes having a low path resistance.

It is already known that semiconductor devices having a low path resistance can be fabricated by depositing very thin epitaxial layers of high-resistance semiconductor material on a low-resistance semiconductor substrate. This technique leads to great difficulties, however, when applied to solid-state circuits containing many semiconductor components in one semiconductor body, these difficulties being particularly noticeable, for example, in the case of digital circuits, which currently represent the main field of application for solid-state circuits. This is true because, in contrast to the case for individual transistors or diodes where the collector connection or one of the diode connections is made at the underside of the semiconductor body and is generally effectuated by soldering to a pedestal or a collector plate, in the case of solid-state circuits having a large number of such components, it is necessary to effectuate all of the connections, including the collector connections, at the upper surface of the semiconductor body. As a result, the collector connections for the transistors contained in such a solid-state circuit are disposed in high resistance material, thereby creating high collector path resistances even when an epitaxial wafer is used as the semiconductor body in the solid-state circuit. In the latter case, it is not even possible to reduce the collector path resistance to the required low value, by means of a diffusion through the high resistance epitaxial layer in order to establish a low resistance connection to the low resistance substrate, because an extremely long time is required to effectuate such a diffusion through a silicon epitaxial layer, even when this layer has a thickness as small as 10$\mu$.

This technique also has the disadvantage that a homogeneous low resistance connection between the collector terminal and the low resistance substrate is not obtainable because a diffusion layer always has a concentration gradient associated with it which inevitably gives the low resistance connection high resistance portions.

Finally, the above-mentioned technique has the disadvantage that its utilization destroys the effectiveness of the passivation layers present on the semiconductor body because these layers are "diffused through " as a result of the extremely long time period during which the diffusion process must be carried out.

It is therefore an object of this invention to eliminate the above-noted disadvantages.

It is a more specific object of this invention to produce solid-state circuits containing, in a semiconductor body, transistors and/or diodes having low path resistances.

Yet another object of the present invention is to provide a simple process for producing such elements.

According to the present invention, these objects are achieved by a method which consists primarily in producing isolated monocrystalline regions in a semiconductor body and partially enclosing each of these regions by a low resistance layer deposited thereon, which layer acts to establish a conductive connection between one surface of each region, which surface is adjacent a supporting layer, and a terminal mounted on that surface of each region which is opposed to the first-mentioned one surface.

In further accordance with the present invention, these objects are achieved by the provision of a device comprising at least one isolated monocrystalline semiconductor region having a semiconductor component formed in one surface thereof and a low resistance layer formed on each isolated region, on at least the surface thereof which is opposite from the surface in which the active component is formed, for establishing a low resistance contact between the surface which is opposite from the surface on which the active component is formed and a terminal point on the surface containing the active semiconductor component.

Additional objects and advantages of the present invention will become apparent upon consideration of the following description when taken in conjunction with the accompanying drawings in which:

FIGURES 1*a* through 1*d* are cross-sectional views showing four stages in one embodiment of the process of the present invention.

FIGURES 2*a* through 2*d* are views similar to those of FIGURES 1 of a second embodiment of the process of the present invention.

Figures 3A, 3B, 3C, 4A, 4B, 4C, 5A, 5B:
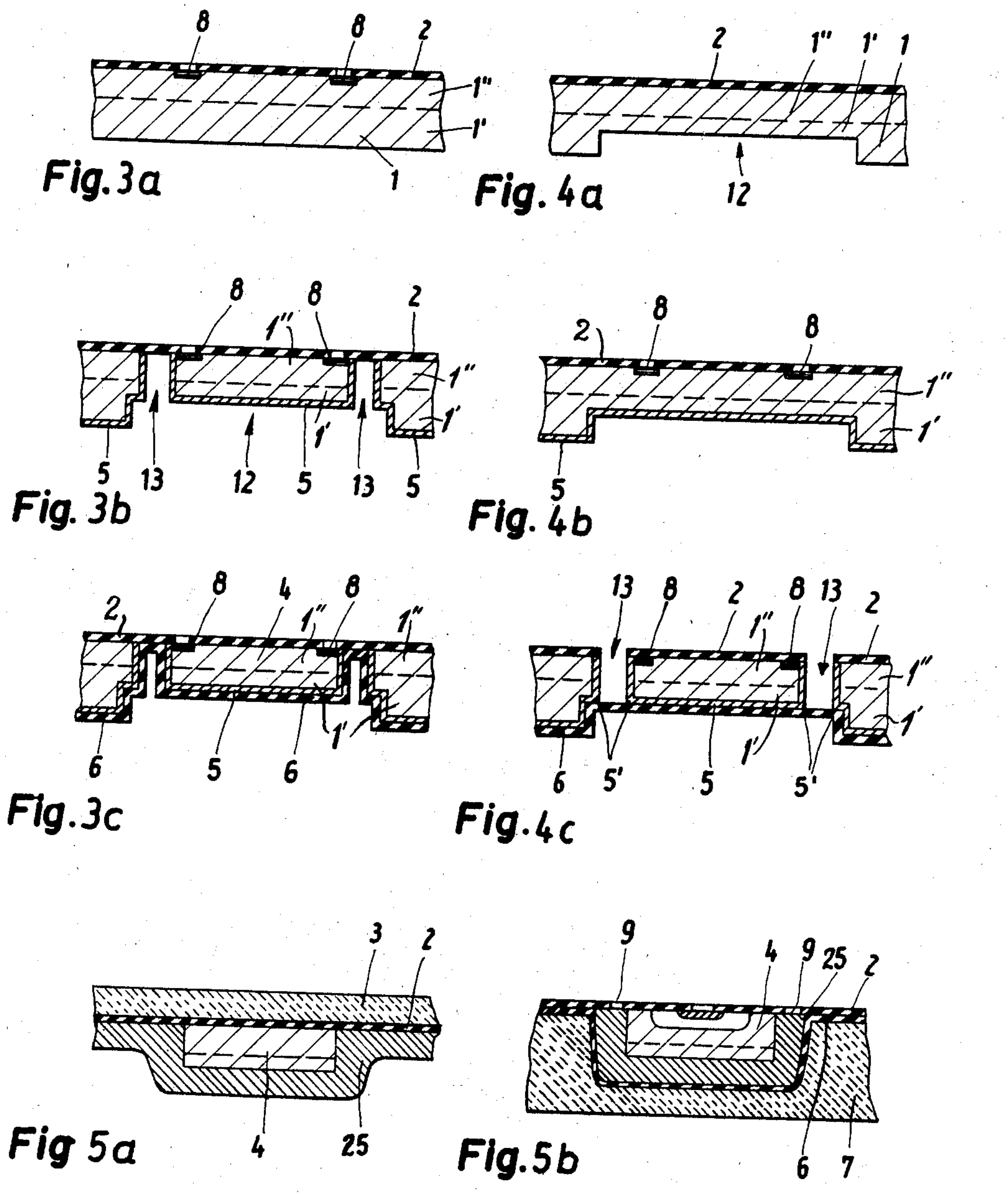

FIGURES 3*a* through 3*c* are cross-sectional views showing three stages in still another embodiment of the process of the present invention.

FIGURES 4*a* through 4*c* are views similar to those of FIGURES 3, showing yet another embodiment of the process of the present invention.

FIGURES 5*a* and 5*b* are cross-sectional views showing two stages in a further embodiment of the process of the present invention.

Turning now to FIGURE 1, and particularly to FIGURE 1*a*, there is shown a monocrystalline semiconductor body 1 constituted, for example, by a silicon semiconductor body having a low resistance substrate 1' and one or more high resistance epitaxial layers 1''. One surface of this body is polished and is provided with an insulating layer 2 which may be constituted, for example, by silicon dioxide. On this insulating layer 2 is disposed a supporting layer 3 which may be constituted, for example, by polycrystalline semiconductor material. Recesses are then etched in the semiconductor body from the underside thereof up to the insulating layer 2 by means of the well known photo-masking technique, for example, so as to produce separated monocrystalline regions 4, one of which is shown in FIGURE 1*b*. Then, a low resistance layer 5 having the same type of conductivity as the region 4 is deposited, for example by means of a suitable one of the well known diffusion processes, on the exposed surfaces of each region 4. According to the present invention, this low resistance layer 5 can also be produced by depositing doping material or heavily doped semiconductor material on the exposed surfaces of the region 4, which deposition can be effectuated, for example, by vapor-deposition or by precipitation from the gaseous phase. For producing n-type, high conductivity layers 5 in silicon, for example, phosphorus may be diffused into region 4 at temperatures around 1250° C. and with concentrations of $10^{21}$ atoms per cubic centimeter. As a further example, molybdenum may be vapor-deposited from $MoCl_5$ source at a typical source temperature of 300° C., while the semiconductor body, in particular region 4, is at 900° C. Under these conditions the deposit is completely alloyed and the deposition rate is about 20 angstrom units per minute. The resistivity of layer 5 is between 20 and $50\times10^{-6}$ ohm-centimeter. High conductivity silicon with resistivities below $10^{-4}$ ohm-centimeter may also be deposited, preferably by pyrolytic growth at about 1250° C.

Figure 1B:
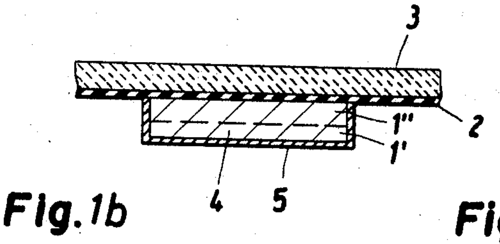
Figure 1C:
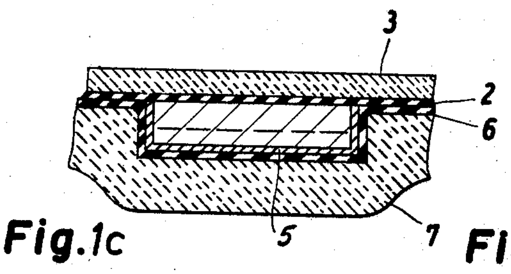
Figure 1D:
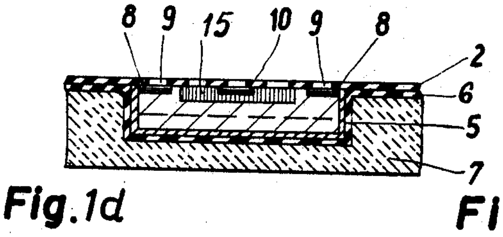

The depth of low-resistance layer 5 may be increased by further temperature treatments, particularly if the subsequently applied insulating layer 6 is deposited by thermal oxidation. However, this further temperature treatment need not be carried out as a separate step because such a result can be achieved automatically during the subsequent production of semiconductor devices in the isolated regions 4, this subsequent production being effectuated, for example, by means of the well known planar technique. In addition, and further according to the present invention, it is possible to produce the low resistance layer 5, or to increase its conductivity, by alloying metallic components to the surface of region 4 or into layer 5. After the formation of layer 5, an insulating layer 6 and a supporting layer 7 are deposited in sequence on the underside of the unit to produce the arrangement shown in FIGURE 1*c*. Layer 7 may then be machined or chemically treated to give it a flat bottom surface and the supporting layer 3 is removed, as shown in FIGURE 1*d*.

After the steps have been carried out, an active and/or passive semiconductor device is then formed in each of the isolated regions 4. For example, FIGURE 1*d* shows a transistor having a collector constituted by the main portion of region 4 and a base and emitter 10 formed in one surface thereof. Base and emitter diffusions, for example, are performed in silicon proceeding after well-known procedures. Boron is used as p-type dopant material. $B_2O_3$ is an appropriate source material which is predeposited at 850° C. in nitrogen, while for boron drive in the temperature is raised to 1200° C. and small amounts of oxygen are added to the nitrogen carrier gas. For the emitter formation, phosphorus is diffused at a typical source temperature of 300° C. and a wafer temperature of 1100° C. For all the diffusion suitable apertures are made in the protective $SiO_2$ layer 2 by applying well-known photoresist masking techniques.

In addition to an emitter 10, the isolated region also has formed thereon one or more low resistance regions 8 having the same type of conductivity as the collector portion of region 4. Both the emitter zone and the low-resistance regions 8 are produced, for example, by diffusion and both may be produced at the same time. For the formation of zones 8 in silicon, for example, again a phosphorus diffusion is performed as described above.

The low resistance regions 8 establish a conductive connection between the low resistance layer 5 and one or more collector terminals 9. If the emitter 10 is not to be diffused to as great a depth as the regions 8, the diffusion of the latter regions should be commenced prior to the diffusion of the emitter. According to another feature of the present invention, it is also possible to produce the regions 8 by diffusion at the very start of the process before the supporting layer 13 has been deposited.

The above-described operations act to produce a composite layer 5–8 which extends around a substantial portion of the periphery of the collector zone and which extends as far as the terminals 9 in layer 2.

This arrangement causes the high resistance collector zone 1, or, in the case of an epitaxial semiconductor body, the high resistance region 1″ of the collector zone, to be bridged by a conductive layer which thus provides a low collector path resistance. One substantial advantage of the method of the present invention lies in the fact that the low resistance composite layer 5–8 is an alloyed layer and so has the conductivity of a metal, thereby giving the path resistance of the semiconductor an extremely low value.

Figure 2A:
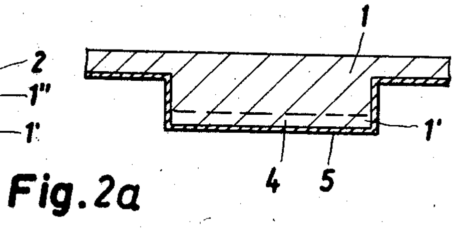
Figure 2B:
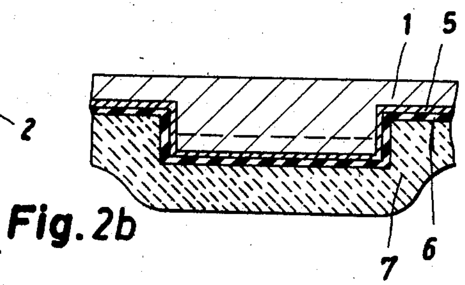
Figure 2C:
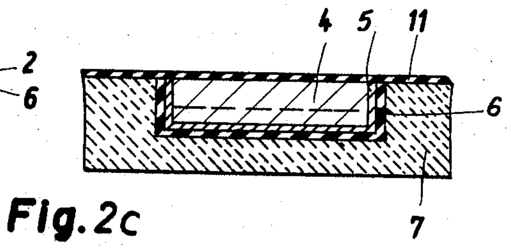

Turning now to FIGURES 2*a*–2*d*, there is shown another embodiment of the method of the present invention in which a high resistance monocrystalline semiconductor body 1 is, if desired, provided with a thin low resistance diffusion or epitaxial layer 1′ on its lower surface. Recesses are etched in the semiconductor body from below by means of the well known photo-masking technique, for example, down to a predetermined depth in such a manner as to produce one or more isolated monocrystalline regions 4, one of which is shown in FIGURE 2*a*. A low resistance layer 5 is then deposited, in the manner described above, on the side of the semiconductor body in which the recesses were etched. Then, an insulating layer 6 and a supporting layer 7 are deposited in sequence on top of layer 5 to produce the assembly shown in FIGURE 2*b*. The supporting layer 7 may then be machined or chemically treated to give it a flat bottom surface, as is shown in FIGURE 2*c*. The semiconductor body 1 is then removed by means of a selective etching process, for example, down to a predetermined depth so that only the isolated monocrystalline regions 4 and the portions of layer 5 surrounding them remain. Then, the semiconductor arrangement is covered with an insulating layer 11 to produce the arrangement of FIGURE 2*c*.

A semiconductor device is then produced on the region 4 in the manner described in connection with FIGURE 1 above, in such a way that the low resistance regions 8 produce a conductive connection between terminals 9 and the layer 1′ of the collector constituted by the main portion of region 4.

Figure 2D:
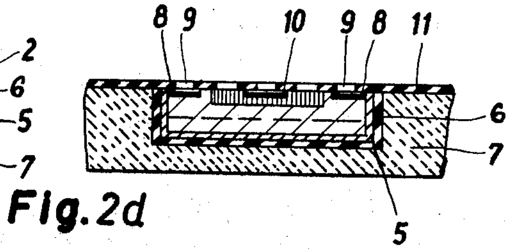

FIGURES 3*a*–3*c* show still another variation of the process of the present invention, wherein a semiconductor body 1 comprising a low resistance substrate 1′ and a high resistance epitaxial layer 1″ is provided with an insulating layer 2 having openings through which low resistance regions 8 are diffused into the semiconductor body at the start of the fabrication process. This arrangement is shown in FIGURE 3*a*. One or more recesses 12, one of which is shown in FIGURE 3*b*, are then etched from below in the semiconductor body up to a predetermined depth and grooves 13 are then etched, by means of a selective etching agent, along the edges of these recesses up to the insulating layer 2. Both the recesses 12 and grooves 13 can be produced with the aid of the photo-masking technique. Then, the low resistance layer 5 is disposed on the exposed surfaces of the remaining portions of body 1 and a continuous insulating layer 6 is deposited so as to cover the low resistance layer 5 and the surfaces of layer 2 forming the bottoms of grooves 13, thereby producing the arrangement shown in FIGURE 3*c*. If desired, the layer 6 may additionally be coated with further insulating and/or semiconductor layers. Finally, active and/or passive semiconductor devices, for example a transistor such as that shown in FIGURES 1*d* and 2*d*, are produced in the isolated regions 4 of the semiconductor arrangement. According to the present invention, it is also possible to produce these semiconductor devices before carrying out the etching processes to form the isolated regions 4.

Turning now to FIGURES 4*a*–4*c*, there is shown yet another embodiment of the process of the present invention wherein a semiconductor body 1 having a low resistance substrate 1′ and an epitaxial layer 1″ is provided on its upper surface with an insulating layer 2 and on its lower surface with recesses 12, one of which is shown in FIGURE 4*a*. Low resistance regions 8 are then produced, in the manner described above, below openings in layer 2 and a low resistance layer 5 is produced on the lower surface of body 1, as shown in FIGURE 4*b*. Then, the semiconductor arrangement is coated with an insulating layer 6 and the openings in insulating layer 2 are filled in. Grooves 13 are then etched through layer 2 into the semiconductor body 1 down to the level of insulating layer 6 in the manner previously described in connection with FIGURES 3, and the surfaces of body 1 exposed by the etching of grooves 13 are covered with low resistance layers 5', by the diffusion of a conductive material, for example, in such a manner that these layers 5' establish low resistance connections between regions 8 on one side of the body portion isolated by grooves 13 and the portion of layer 5 on the other side thereof. The resulting arrangement is shown in FIGURE 4*c*.

The production of layers 5' can be carried out simultaneously with the production, by diffusion, of an emitter (not shown) in this isolated portion of the semiconductor body 1. Thus, no added production time is required for the fabrication of these layers 5'. According to the present invention, it is also possible to produce the semiconductor devices at the same time as the production of the low resistance regions 8.

FIGURES 5*a* and 5*b* show one final embodiment of the process of the present invention in which isolated monocrystalline regions 4 are produced in the same manner described in connection with FIGURES 1*a* and 1*b*, for example, and a heavily doped semiconductor layer 25 is deposited so as to cover all of the exposed surfaces of the regions 4. The arrangement thus produced is shown in FIGURE 5*a*. Silicon, for example, is deposited at a substrate temperature of 1250° C. from a $SiCl_4$ source using hydrogen as carrier gas. Hydrogen additionally bubbles through a $PCl_3$ dopant liquid, hence, sufficient amounts of n-type doping materials are added. The epitaxial deposit has a very low resistivity, typically below $10^{-4}$ ohm-centimeter.

During deposition, the layer 25 will normally grow epitaxially on the monocrystalline region 4 and in polycrystalline form on the insulating layer 2. Most of the portion of layer 25 deposited on the insulating layer 2 can be subsequently removed therefrom by a selective etching process, for example, using appropriate masking techniques, if a separation of the monocrystalline regions 4 is required. Then, an insulating layer 6 and a supporting layer 7 are again deposited on the lower side of the unit and the supporting layer 3 is removed, to yield the structure shown in FIGURE 5*b*. Then a transistor is again produced in the isolated region 4 in the manner set forth in connection with the preceding figures, and direct contact is made to the low resistance layer 25, and hence to the collector zone of the transistor, by means of terminals 9 disposed in openings in layer 2. The unnumbered regions of FIGURE 5*b* are emitter and base regions formed by phosphorous and boron diffusions, for example, in the manner set forth in connection with FIGURES 1*d* and 2*d*.

The heavily doped layer 25 is preferably precipitated from the gaseous phase. Since the precise crystal structure of this layer is not of great importance in this case, it is possible to achieve specific resistances for the layer 25 of the order of $10^{-5}$ ohm-cm. For this reason, and because of the extremely short distance between the collector barrier layer and the terminal 9, it is possible to achieve the minimum possible collector path resistance with the arrangement shown in FIGURE 5*b*.

The method of the present invention is also suitable for the fabrication of passivated transistors with non-diffused base zones in a semiconductor body forming a part of a solid-state circuit, for example. At low current levels, such transistors have greater current amplification, a higher cut-off frequency and a higher emitter breakdown voltage than transistors of the diffused base zone type. Transistors with non-diffused base zones are produced, for example, by means of the method described in connection with FIGURES 1. In this case, the low-resistance substrate 1' of the semiconductor body 1 has an n-type conductivity, for example, while the higher resistance epitaxial layer 1" has a p-type conductivity, so that a pn-junction forming a base-to-collector junction exists between layers 1' and 1". The subsequently applied low resistance layer 5 or 25 is given the same type of conductivity as the substrate 1', this being an n-type conductivity in the present example, so that the resulting pn-junction is given an upward bend and is passivated by the insulating layer 2, as can best be seen in FIGURE 1*b*. The further steps in this particular method are the same as those described in connection with FIGURES 1. The base diffusion zone illustrated in FIGURE 1*d* is omitted from the process of this example.

According to the present invention, it is also possible to omit the insulating layer 6 if it is unnecessary to have a separation between the various regions 4, as in the case where the transistors produced will be physically separated from each other at the end of the fabrication process.

The process described in connection with FIGURE 5 presents another possibility for producing passivated transistors having non-diffused base zones. In this case, the broken line through region 4 represents the base-to-collector pn-junction, the two portions of region 4 having opposite types of conductivity, and the base diffusion zone illustrated in FIGURE 5*b* is omitted.

According to the present invention, it is also possible to give the layer 25 of FIGURE 5 a doping concentration gradient or to fabricate it from a thin medium-resistance layer and a thick low resistance layer deposited thereon in order to arrive at the specific collector barrier layer characteristics desired. These techniqus may also be applied to the production of the semiconductor body, which may be selected to have a low resistance and which may be given a suitable doping gradient.

The base resistance of the non-diffused base zone transistors produced according to the present invention can be made quite low if a heavily doped zone having the same type of conductivity as the base zone, for example, a $p^+$-zone, is diffused around the emitter zone 10 shown in FIGURES 1*d* and 2*d*. The zone 15, shown in FIGURE 1*d*, is arranged to surround the emitter 10 with a lateral spacing between emitter 10 and zone 15. In such a configuration the emitter front and sidewalls are faced to non-diffused base regions of the base 1". The diffusion depth of the $p^+$-zone is approximately equal to the depth of the emitter 10. It is, however, for some applications advantageous that the $p^+$-zone of the base touches the periphery of the emitter 10 or even overlaps the emitter. The width of the spacing or the range of overlapping is determined according to whether preference is to be given to a higher emitter breakdown voltage or to a limitation of the emission in the emitter boundary region. In the latter case, the emitter peripheral concentration is reduced and the associated base concentration is increased in order to arrive at a reduction in the emission occurring in the emitter boundary region, however, the emitter efficiency at the front area of region 10 is not affected.

It will be understood that the above description of the present invention is susceptible to various modifications, changes and adaptations and the same are intended to be comprehended within the meaning and range of equivalents of the appended claims.

What is claimed is:

1. A method for producing active components having low path resistances in a solid-state circuit, comprising the steps of:

(a) dividing a semiconductor body into a plurality of physically separated, electrically isolated monocrystalline regions, each such region having two opposed surfaces and at least one lateral surface extending between the two opposed surfaces and a zone of a first conductivity type extending to one opposed surface thereof and at least partially through such region; and (b) partially enclosing each such region by covering at least part of such one surface and at least a lateral surface portion extending between the opposed surfaces with a low-resistance layer so as to establish a highly conductive connection between such one surface and a terminal mounted on the other opposed surface of such region.

2. A method as defined in claim 1 wherein said low resistance layer comprises a metal.

3. A method as defined in claim 1 wherein said step of partially enclosing each of said regions is carried out by precipitating a thick, low-resistance layer on the exposed surfaces of each of said isolated regions and by establishing a conductive connection with each said layer at a point where it is adjacent one unexposed surface of said region.

4. A method as defined in claim 1 wherein said semiconductor body is constituted by a low-resistance substrate having a higher resistance epitaxial layer of the opposite conductivity type formed thereon and extending entirely across said body, and wherein said zone of each said isolated region is constituted by a portion of said substrate.

5. A method for producing active components having low path resistances in a solid-state circuit, comprising the steps of:

(a) producing isolated monocrystalline regions in a semiconductor body, each such region having at least one zone of a first conductivity type extending to one surface thereof, said step of producing isolated regions being carried out by covering said semiconductor body with a first insulating layer, covering said insulating layer with a first supporting layer, and etching recesses in said semiconductor body, starting from the side thereof which is opposite from said insulating layer, down to said insulating layer to form said isolated regions;

(b) partially enclosing each of said regions by forming a low-resistance layer on the exposed surfaces of each said region for establishing a conductive connection between said one surface of each said region and a terminal mounted on that surface of each said region which is opposed to said one surface;

(c) depositing a second insulating layer on all of said low-resistance layers;

(d) depositing a second supporting layer on said second insulating layer;

(e) removing said first supporting layer;

(f) forming a semiconductor device in each of said isolated regions; and (g) forming low-resistance regions of said first conductivity type for establishing a low-resistance connection to each of said low-resistance layers.

6. A method as defined in claim 5 wherein each said low resistance layer is formed by a diffusion process.

7. A method for producing active components having low path resistances in a solid-state circuit, comprising the steps of:

(a) etching recesses in a semiconductor body from one side thereof down to a predetermined depth;

(b) producing a low-resistance layer of a material which is of a first conductivity type on the surface of the semiconductor body in which such recesses are etched;

(c) covering said low-resistance layer with a first insulating layer;

(d) covering said first insulating layer with a supporting layer;

(e) removing a portion of said semiconductor body, starting from the side thereof which is opposite from said first insulating layer, down to said first insulating layer to form a plurality of isolated monocrystalline regions which are embedded in said first insulating layer, each such region having two opposed surfaces and a zone of the first conductivity type extending to one opposed surface thereof and at least partially through such region, each region being covered with a low-resistance layer so as to establish a conductive connection between such one surface and a terminal mounted on the other opposed surface of such region;

(f) forming an active semiconductor device in each of said isolated regions; and (g) forming low-resistance regions of said first conductivity type for establishing a low-resistance connection to the low-resistance layer associated with each of said isolated regions.

8. A method for producing active components having low path resistances in a solid-state circuit, comprising the steps of:

(a) dividing a semiconductor body into a plurality of isolated monocrystalline regions, each such region having two opposed surfaces and a zone of a first conductivity type extending to one opposed surface thereof and at least partially through such region, said step of dividing being carried out by covering said semiconductor body with a first insulating layer, producing low-resistance regions of said first conductivity type in said semiconductor body below said first insulating layer, and etching recesses in said semiconductor body, starting from the side thereof which is opposite from said first insulating layer, down to said insulating layer to form said isolated regions;

(b) partially enclosing each such region with a low-resistance layer so as to establish a conductive connection between such one surface and a terminal mounted on the other surface of such region, said step of partially enclosing being carried out by producing said low-resistance layer on the exposed surfaces, including said one surface, of each said region with each said low-resistance layer being in conductive contact with the zone of its associated isolated region;

(c) providing a second insulating layer on all of the low-resistance layers associated with said isolated regions; and (d) producing an active semiconductor device in each of said isolated regions.

9. A method for producing active components having low path resistances in a solid-state circuit, comprising the steps of:

(a) coating one side of a semiconductor body with a first insulating layer;

(b) etching recesses in said semiconductor body, starting from the side thereof which is opposite from said insulating layer, down to a predetermined depth;

(c) producing low-resistance regions of a first conductivity type in the surface of said semiconductor body which is covered by said insulating layer;

(d) producing a low-resistance layer on the side of said semiconductor body in which said recesses have been etched;

(e) providing a second insulating layer on said low-resistance layer;

(f) etching grooves through said first insulating layer and through said semiconductor body down to said second insulating layer to divide said semiconductor body into a plurality of isolated monocrystalline regions, each such region having two opposed surfaces and a zone of a first conductivity type extending to one opposed surface thereof and at least partially through such region;

(g) lining the walls of said grooves with low-resistance material to provide a conductive connection between that portion of said low-resistance layer and those ones of low-resistance regions which are associated with the same isolated semiconductor region; and (h) producing an active semiconductor device in each of said isolated regions.

References Cited

UNITED STATES PATENTS

| | | | |
|---|---|---|---|
| 2,981,877 | 4/1961 | Noyce | 317—235 |
| 3,158,788 | 11/1964 | Last | 317—101 |
| 3,189,973 | 6/1965 | Edwards | 148—174 |
| 3,199,002 | 8/1965 | Martin | 317—234 |
| 3,237,062 | 2/1966 | Murphy | 317—234 |
| 3,290,753 | 12/1966 | Chang | 29—577 |
| 2,967,344 | 1/1961 | Mueller | 29—578 |
| 3,054,034 | 9/1962 | Nelson. | |
| 3,340,601 | 9/1967 | Garibotti | 29—582 |

OTHER REFERENCES

IBM Tech. Disc. Bull., vol. 3, No. 12, May 1961 pages 26 and 27.

"Electronic Equipment Engineering," December 1964, pages 18–20.

WILLIAM I. BROOKS, *Primary Examiner.*

U.S. Cl. X.R.

29—578, 589; 148—175, 187